(12) United States Patent
Ito et al.

(10) Patent No.: US 6,509,125 B1
(45) Date of Patent: Jan. 21, 2003

(54) COLOR FILTER AND LIQUID CRYSTAL DISPLAY DEVICE HAVING THE SAME

(75) Inventors: Hiromitsu Ito, Tokyo (JP); Hidesato Hagiwara, Tokyo (JP); Tadashi Hosono, Tokyo (JP); Mizuhiro Tani, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 09/383,237

(22) Filed: Aug. 26, 1999

(30) Foreign Application Priority Data

Aug. 28, 1998 (JP) ............................. 10-243489
Sep. 25, 1998 (JP) ............................. 10-271491

(51) Int. Cl.$^7$ .......................... G02B 5/20; G02F 1/1335
(52) U.S. Cl. ............................................ 430/7; 349/106
(58) Field of Search ................................ 430/7; 349/106

(56) References Cited

U.S. PATENT DOCUMENTS

| | | | |
|---|---|---|---|
| 4,752,447 A | 6/1988 | Kimmel et al. ............... 422/56 |
| 5,391,447 A | 2/1995 | Pai et al. ....................... 430/59 |
| 5,532,111 A | * 7/1996 | Holmes et al. ............. 430/281.1 |
| 5,578,419 A | * 11/1996 | Itoh et al. .................. 430/281.1 |
| 5,645,963 A | * 7/1997 | Chang ............................. 430/7 |
| 6,063,175 A | * 5/2000 | Harris ....................... 106/31.43 |

FOREIGN PATENT DOCUMENTS

| | | |
|---|---|---|
| EP | 0193036 B1 | 9/1986 |
| EP | 0193036 A2 | 9/1986 |
| EP | 0531106 B1 | 3/1993 |
| EP | 0531106 A1 | 3/1993 |
| JP | 4-243 | 1/1992 |
| JP | 4-301802 | 10/1992 |
| JP | 6-35183 | 2/1994 |

* cited by examiner

*Primary Examiner*—John A. McPherson
(74) *Attorney, Agent, or Firm*—Armstrong, Westerman & Hattori LLP

(57) ABSTRACT

A color filter includes a plurality of colored layers which are arranged adjacently to each other and have different spectroscopic properties. At least one colored layer contains a dye chemically bonded to a polymer chain.

2 Claims, 2 Drawing Sheets

COLOR FILTER AND LIQUID CRYSTAL DISPLAY DEVICE HAVING THE SAME

BACKGROUND OF THE INVENTION

The present invention relates to a color filter, and a liquid crystal display device having the same. In particular, the present invention relates to a color filter having colored layers containing a dye-bonded polymer, and a liquid crystal display device having the same.

As a color filter for a display device, various types are known, but a color filter for liquid crystal display is herein explained as a typical example. Various liquid crystal displays are widely used, including from liquid crystal displays having a small area for, e.g., a clock and a camera to ones having a large area for, e.g., a computer terminal display device and a television screen display device. Recently, color display has rapidly been developed mainly for liquid crystal display devices having a large area. A color filter is essential for colored liquid crystal display, and is an important member which decides the performance of color liquid crystal display. In order to display highly minute images, color filters which are minutely patterned into various forms are used. As a conventional method for producing a color filter, there are known dyeing, ink jet, printing and photolithographic methods.

The dyeing method is a technique of producing a color filter by repeating, for each of red, green and blue colors, the step of forming a given filter pattern and then dyeing the filter pattern in each of the colors and the step of blocking the dyeing. This method has such drawbacks that the steps are complicated and the number of the total steps is large. Against this method, proposed are color filter producing methods that have fewer steps and are more effective. These methods include, for example, the ink jet method that uses an ink jet device, wherein an ink is jetted onto a transparent substrate, as a base, and the ink on the substrate is fixed to color the substrate; and a printing method that uses a printer to transfer an ink onto a transparent substrate as a base. In these methods, the positioning of patterns is performed by means of an ink jet head, or a printer and a printing plate. Therefore, the step of patterning colored layers is unnecessary. According to these methods, however, it is difficult to form a highly minute filter.

The photolithographic method is classified into direct photolithography and indirect photolithography (the etching method). The direct photolithography is to apply a color solution wherein a colorant and a photosensitive polymer are dissolved or dispersed in a solvent onto a substrate to form a colored layer, irradiate (pattern) the colored layer with light, and develop the colored layer to form a one-colored pattern. In this method, these consecutive steps are repeated for respective colors in the same way as in the dyeing method. However, this method does not require any dyeing step or the step of blocking the dyeing. Therefore, the steps in the direct photolithography are fewer than those in the dyeing manner. Besides, it is possible to realize control of spectroscopic property and reproducibility easily. Since photolithography is used in this method, resolving power is high so that a highly minute color filter, which cannot easily be obtained by the printing method or the ink jet method, can be made. Recently, therefore, this method has been the main current in the production of color filters for liquid crystal display.

The etching method is to apply a photoresist having photosensitivity onto a colored layer having no photosensitivity, dry the photoresist, irradiate the photoresist with light to form a pattern, conduct treatment with a solvent with which only the colored layer can be removed, and remove the photoresist. These consecutive steps are repeated to make a color filter. The etching method is a promising method for forming highly minute pixels.

In such methods using photolithography, a pigment has been conventionally used as a colorant since the pigment generally has good resistances against heat, light and chemicals. However, the pigment has a certain particle size bringing about depolarization, and thus it is known that the display contrast ratio of color liquid crystal devices deteriorates. It is also difficult to obtain high light transmissivity. Thus, such methods have a limit for an improvement in brightness of color filters.

On the other hand, dyes are generally soluble in solvents or polymers. Further, dyes are not aggregated in colored solutions for color filters, and are stable. In a color filter obtained by using a colored solution wherein a dye is dispersed, depolarization does not arise since a dye is dispersed at a molecule level. Light transmissivity is also good. However, dye-dispersed color filters have poorer resistances against heat, light and chemicals than pigment-dispersed color filters.

In order to improve the resistances against heat, light and chemicals, for example, the following methods are proposed: a method that uses a colored solution for color filters wherein a polyimide precursor, a disperse dye and an oil-soluble dye are dissolved in a solvent, so as to form a pattern by the etching method (Jpn. Pat. Appln. KOKOKU Publication No. 4-243), and a method that uses a colored solution for color filters comprising a positive resist, a crosslinking agent and a dye to form a pattern by the etching method (Jpn. Pat. Appln. KOKAI Publication No. 4-301802 and Jpn. Pat. Appln. KOKAI Publication No. 6-35183). In all of these methods, colored compositions wherein a dye, instead of a pigment, is merely dispersed in a resin are used. There remains a problem that the dye is eluted out in development or the dye is sublimated in heating.

Concerning some of the dyes, in order to solve the problems of elution and sublimation, it has been proposed to covalently bond an acryloyl group to a dye and copolymerize the resultant dye with other polymerizable monomer. The proposed method is, however, related to only specific dyes in academic study. There is not any specific description on common dyes. The method is not proposed for color filters. As a result, it is not considered that some hue is changed at the time of introducing a substituent such as an acryloyl group.

Thus, by photolithography there is not obtained any practical color filter wherein a dye is used to have high contrast ratio, minuteness, transparency and color purity and excellent resistances against heat, light, chemicals and sublimation.

BRIEF SUMMARY OF THE INVENTION

Therefore, an object of the present invention is to provide a dye-containing color filter, making it possible to prevent a dye from being sublimated, having higher spectroscopic property and contrast ratio than color filters using only a pigment, and exhibit high resistances against heat, light and chemicals.

The above object and other objects which will be evident from the following description have been achieved according to the present invention by a color filter comprising a plurality of colored layers which are arranged adjacently to each other and have different spectroscopic properties, wherein at least one of the plurality of colored layers contains a dye chemically bonded to a polymer chain.

In the present invention, the dye bonded to the polymer chain may be an oil-soluble dye such as an anthraquinone or triphenylmethane dye.

According to the present invention, there is also provided a liquid crystal display device comprising a color filter of the present invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
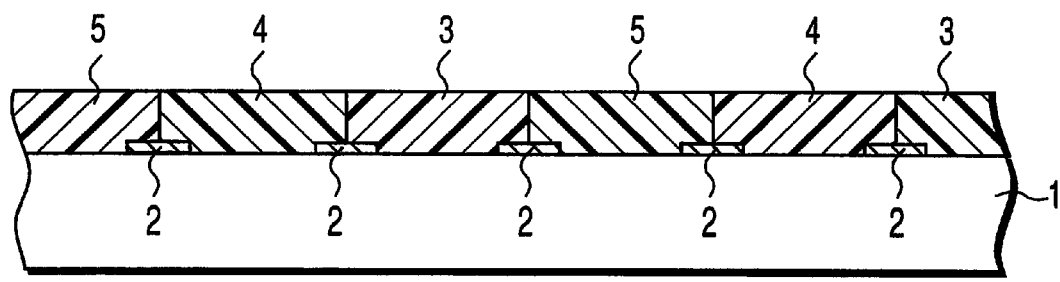
FIG. 1 is a cross sectional view of an example of the color filter of the present invention.

The present invention will be more specifically described below.

The present invention relates to a color filter comprising a plurality of colored layers which are arranged adjacently and have different spectroscopic properties. In the present invention, at least one colored layer among the plural colored layers contains a dye bonded to a polymer chain (polymer dye).

The polymer dye of the present invention can be obtained by homopolymerzation of a polymerizable dye monomer or copolymerzation of a polymerizable dye monomer with other polymerizable monomer(s) (i.e., comonomer(s)), as will be described in detail hereinafter. The polymer dye of the present invention can also be obtained by polymer-reaction of a dye with a polymer having a functional group which can be reacted with the dye. In the case that the polymer dye is a homopolymer of a polymerizable dye monomer in the present invention, the homopolymer includes a dimer, a trimer, and an oligomer.

Examples of the dye used in the present invention include oil-soluble dyes such as azo, stylbene, di- or triphenylmethane, xthantene, acrydine, quinoline, (poly) methine, thiazole, oxazine, aminoketone, hydroxyketone, phthalocyanine, and anthraquinone dyes. The dye should not, however, be limited to these examples. Any combination of two or more of these dyes may be used. Among these dyes, anthraquinone and triphenylmethane dyes are especially preferred from the standpoint of properties such as solubility, color purity and transparency.

The polymerizable dye monomer of the present invention may be obtained by introducing a polymerizable moiety into a basic dye skeleton having a functional group by a usual organic synthesis method, or introducing a polymerizable moiety into a raw material of dye-synthesis and then synthesizing a dye. In the case that the basic dye skeleton has, for example, a hydroxyl group, this skeleton can be reacted with carboxylic acid chloride having a polymerizable group to produce an ester-bond between them to form a desired polymerizable dye monomer. In all cases, plural polymerizable moieties may be introduced. Specific examples of the anthraquinone dye are shown in Table A.

TABLE A

| No. | Dye Structure | No. | Dye Structure |
|---|---|---|---|
| 1 | anthraquinone with NH—CH$_2$CH$_2$OOCCH=CH$_2$ substituent | 2 | complex anthraquinone derivative with NH—C$_6$H$_4$—CH$_2$OOCCH=CH$_2$ and NH—CO—C$_6$H$_3$Cl$_2$ substituents |
| 3 | anthraquinone with NH—C$_6$H$_4$—CH$_3$ and O—CH$_2$COOCH=CH$_2$ substituents | 4 | anthraquinone with NH—C$_5$H$_{11}$ and NH—CH$_2$OCOCH=CH$_2$ substituents |

TABLE A-continued
| No. | Dye Structure | No. | Dye Structure |
|---|---|---|---|
| 5 | 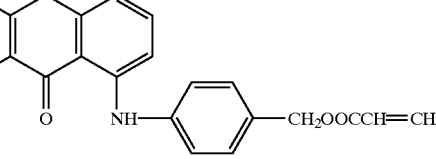 | 6 | 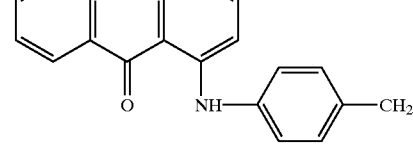 |
| 7 | 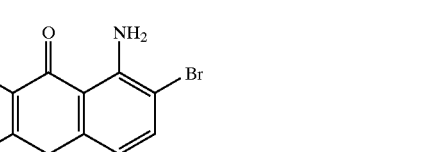 | 8 | 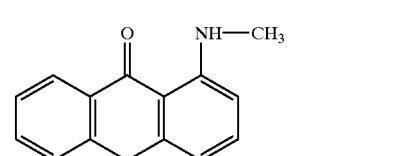 |
| 9 | 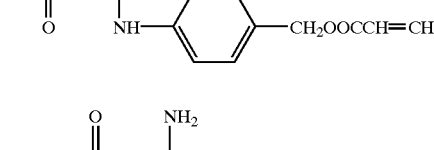 | 10 | 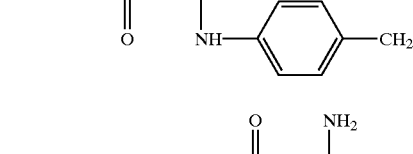 |
| 11 | 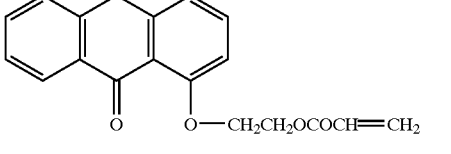 | 12 | 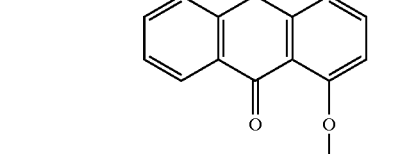 |
| 13 |  | 14 |  |

TABLE A-continued
| No. | Dye Structure | No. | Dye Structure |
|---|---|---|---|
| 15 | 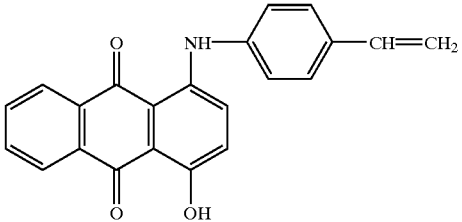 | 16 | 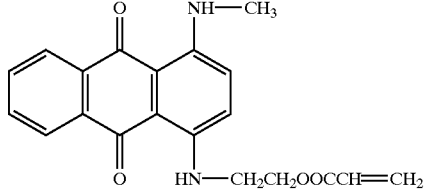 |
| 17 | 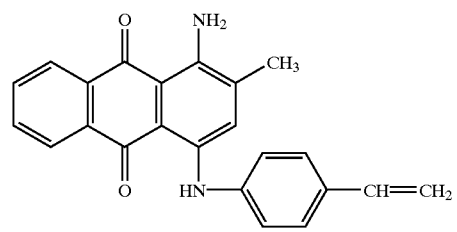 | 18 | 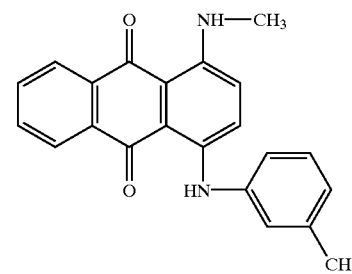 |
| 19 | 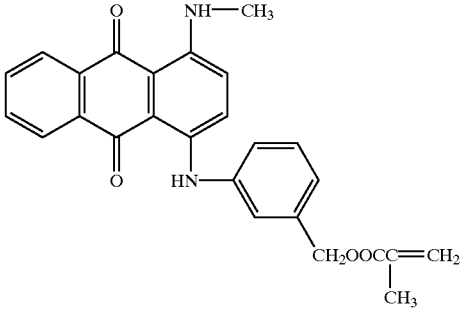 | 20 | 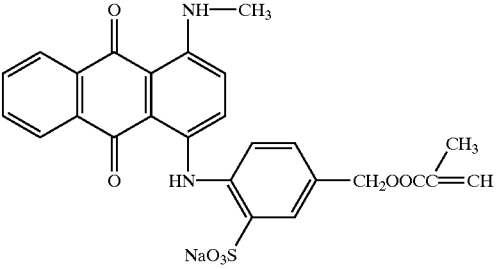 |
| 21 | 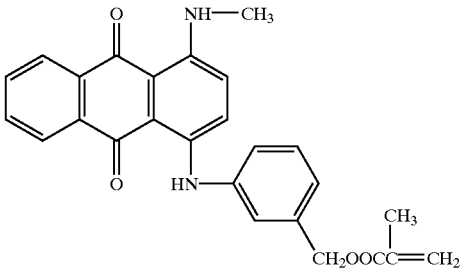 | 22 | 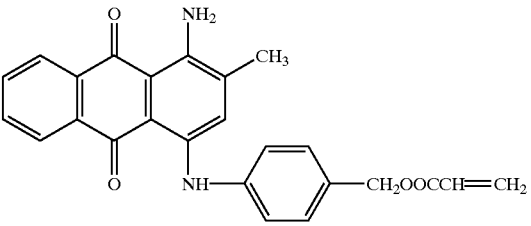 |
| 23 | 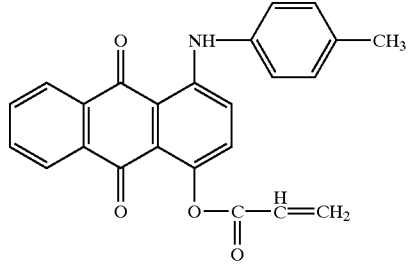 | | |

A polymerizable triphenylmethane dye monomer can be represented by the following general formula (1):

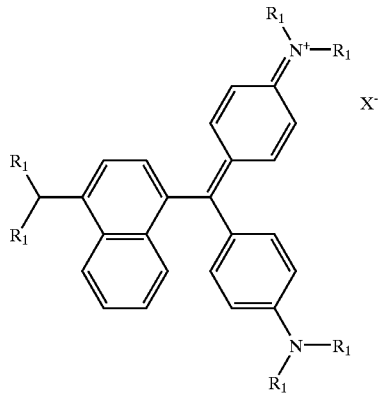

(1)

where $R_1$ independently represents a polymerizable group selected from $CH_2=CH-COO-R_2-$, $CH_2=C(CH_3)-COO-R_2-$, $CH_2=CH-Ph-CH_2-$ and $CH_2=CH-CO-$, a hydrogen atom, or an alkyl or hydroxyalkyl group having 1 to 8 carbon atoms, wherein at least one $R_1$ is the polymerizable group; $X^-$ represents an anion; Ph represents a phenyl group, and $R_2$ is an alkylene group having 2 to 4 carbon atoms.

Examples of the alkyl group having 1 to 8 carbon atoms, represented by $R_1$ in the formula (1), include methyl, ethyl, propyl, isopropyl, butyl, sec-butyl, tert-butyl, isobutyl, amyl, tert-amyl, hexyl, heptyl, octyl, isooctyl, tert-octyl, and 2-ethylhexyl. Examples of the hydroxyalkyl group having 1 to 8 carbon atoms, represented by $R_1$, include a hydroxyalkyl group wherein a hydrogen atom of the above-mentioned alkyl group is replaced by a hydroxyl group. Examples of the alkylene group having 2 to 4 carbon atoms, represented by $R_2$, include ethylene, trimethylene and tetramethylene.

Examples of the anion represented by $X^-$ in the formula (1) include halide anions such as anions of chlorine, bromine, iodine and fluorine; inorganic anions such as anions of perchloric acid, thiocyanic acid, phosphorus hexafluoride, antimony hexafluoride and boron tetrafluoride; organic sulfonic acid anions such as anions of benzenesulfonic acid, toluenesulfonic acid and trifluoromethanesulfonic acid; organic phosphoric acid anions such as anions of octylphosphoric acid, dodecylphosphoric acid, octadecylphosphoric acid, phenyl phosphoric acid and nonylphenylphosphoric acid.

A typical example of the dye monomer, represented by the formula (1), is a compound represented by the formula (2) below, which exhibits a blue hue. The present invention should not, however, be limited to the compound listed below as an example. The example listed below is indicated as a cationic form of the dye monomer wherein its anion is omitted.

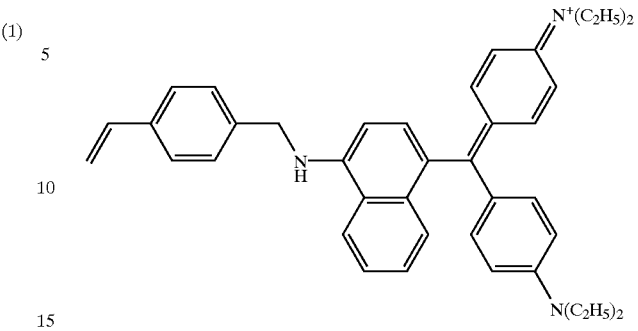

(2)

The comonomer copolymerized with the dye monomer of the present invention to produce the polymer dye of the present invention may be any polymerizable comonomer if the comonomer can be copolymerized with the dye monomer. Examples of the comonomer include styrene compounds, carboxylic acid monomers, in particular α, β-unsaturated mono- or poly-carboxylic acids, esters thereof, amides thereof, anhydrides thereof, and vinyl compounds. Examples of the styrene compounds include styrene, α-methylstyrene, hydroxystyrene, p-chloromethylstyrene, and m-chloromethylstyrene. Examples of the α,β-unsaturated carboxylic acids include acrylic acid, methacrylic acid, maleic acid, fumaric acid, itaconic acid, citraconic acid, mesaconic acid, and 1-butyne-2,3,4-tricarboxylic acid. Examples of the ester of the unsaturated carboxylic acid include methyl ester, ethyl ester, 2-hydroxyethyl ester, propyl ester, butyl ester, octyl ester, dodecyl ester, 2,2,6,6-tetramethyl-4-pyperidyl ester, 1,2,2,6,6-pentamethyl-4-pyperidyl ester and 2-[3-(2-benzotriazolyl)-4-hydroxyphenyl]ethyl ester of the above-mentioned α, β-unsaturated carboxylic acids. Examples of the amide of the unsaturated carboxylic acid include methylamide, dimethylamide, ethylamide, diethylamide, propylamide, dipropylamide, butylamide, dibutylamide, hexylamide, octylamide and phenylamide of the above-mentioned α,β-unsaturated carboxylic acids. Examples of the imide of the unsaturated carboxylic acid include maleimide, itaconic imide, N-butylmaleimide, N-octylmaleimide, and N-phenylmaleimide. Examples of the vinyl compound include vinyl acetate, N-vinylcarbazole and N-vinylpyrrolidone.

The homopolymer or copolymer having the above-mentioned dye can easily be obtained by a usual polymerization method. The copolymer of the comonomer and the dye monomer of the present invention can be produced by reacting 5 to 100000 g of the comonomer with 100 g of the dye monomer of the present invention.

On the other hand, in the case that a dye-bonded polymer is obtained by polymer-reaction, it is preferable to react either a polymer obtained as a homopolymer of a polymerizable monomer having a reactive functional group, or a polymer obtained as a copolymer of such a polymerizable monomer and the above-mentioned comonomer with a dye having a functional group which can be reacted with the above-mentioned functional group on the polymerizable monomer by a common organic synthesis reaction. The reactive functional group on the polymerizable monomer includes a hydroxyl group, a carboxyl group, an amino group, an alkyl halide group, carboxylic salt, or ammonium salt. Generally, a dye has a hydroxyl group or an amino group as a functional group.

Specific examples of the polymerizable monomer having a functional group such as a hydroxyl group, a carboxyl group, an amino group, an alkyl halide group, carboxylic salt, or ammonium salt include (meth)acrylic acid, 2-acryloyloxyethyl hydrogen phthalate, 2-hydroxyethyl acrylate, 2-hydroxypropyl acrylate, 2-acryloyloxyethyl-2-hydroxypropyl phthalate, 2-hydroxy-3-phenoxypropyl acrylate, 2-acryolyloxypropyl hydrogen phthalate, vinyl chloroacetate, chloromethylstyrene, β-acryloyloxyethyl hydrogen succinate, 2-hydroxy-3-chloropropyl acrylate, methacryloyloxyethyltrimethylammonium chloride, methacryloyloxypropyltrimethylammonium chloride, methacryloylamidopropyltrimethylammonium chloride, N-methylolacryl amide and potassium methacrylate. The polymerizable monomer should not, however, be limited to these examples.

It is possible to obtain a color filter which has resistance against heat, light and chemicals, and has high transparency and high color purity by using the dye-bonded polymer of the present invention. In order to improve the spectroscopic property of this color filter, a pigment may also be used simultaneously. In order to adjust the spectroscopic property, other dye(s) may be used as a color adjuster.

Specific examples of such a pigment include Pigment Red 9, 19, 38, 43, 97, 122, 123, 144, 149, 166, 168, 177, 179, 180, 192, 215, 216, 208, 217, 220, 223, 224, 226, 227, 228 or 240; Pigment Blue 15, 15: 6, 16, 22, 29, 60 or 64; Pigment Green 7 or 36; Pigment Yellow 20, 24, 86, 81, 83, 93, 108, 109, 110, 117, 125, 137, 138, 139, 147, 148, 153, 154, 166, 168 or 185; Pigment Orange 36; and Pigment Violet 23. The dye should not, however, be limited to these examples. Two or more of these dyes may be mixed and used to obtain a desired hue.

Specific examples of the color adjuster include Acid Red 52, 87, 92, 122 or 486; Solvent Red 8, 24, 83, 109, 125 or 132; Disperse Red 60, 72, 88 or 206; Basic Red 12 or 27; Acid Blue 9, 40, 83, 129 or 249; Solvent Blue 25, 35, 36, 55, 67 or 70; Disperse Blue 56, 81, 60, 87, 149, 197, 211 or 214; Basic Blue 1, 7, 26 or 77; Acid Green 18; Solvent Green 3; Basic Green 1; Acid Yellow 38 or 99; Solvent Yellow 25, 88, 89 or 146; Disperse Yellow 42, 60, 87 or 198; and Basic yellow 21. The color adjuster should not, however, be limited to these examples.

The colored layer containing the polymer dye of the present invention may further contain a soluble polymer. The soluble polymer may be a polymer which is soluble in an organic solvent, an alkaline aqueous solution, water or the like, and is not especially limited. In general, the soluble polymer can be obtained by copolymerzing a hydrophilic monomer, the typical examples of which include (meth) acrylic acid, 2-hydroxyethyl acrylate, acrylamide, N-vinylpyrrolidone and a monomer having an ammonium salt, with a hydrophobic monomer, the typical examples of which include (meth)acrylic ester, vinyl acetate, styrene, and N-vinylcarbazole at an appropriate blend ratio in a known manner.

Further, a colored layer containing the polymer dye of the present invention can contain a polymer of polymerizable monomers which is polymerized in situ at the time of irradiation with light. The polymerizable monomer is a monomer having at least one ethylenically unsaturated bond in its structural unit, and may be a monofunctional vinyl monomer, or a polyfunctional vinyl monomer. Specific examples thereof include high-boiling point vinyl monomers such as (meth)acrylic acid, itaconic acid, maleic acid, (meth) acrylamide, diacetone acrylamide and 2-hydroxyethyl (meth)acrylate; di or poly (meth)acrylic esters of aliphatic polyhydroxy compounds such as ethylene glycol, diethylene glycol, triethylene glycol, tetraethylene glycol, propylene glycol, dipropylene glycol, tripropylene glycol, tetrapropylene glycol, neopentyl glycol, 1,3-propanediol, 1,4-butanediol, 1,5-pentanediol, 1,6-hexanediol, 1,10-decanediol, trimethylol propane, pentaerythritol, dipentaerythritol, sorbitol and mannitol; alicyclic monomers such as dimethyloltricyclodecane monoacrylate and dimethyloltricyclodecane diacrylate; di or poly(meth)acrylic esters of aromatic polyhydroxy compounds such as hydroquinone, resorcine, cathechol, pyrogallol and bisphenol A; ethyleneoxide-modified (meth) acrylic ester of isocyanuric acid; as well as 2-phenoxyethyl acrylate, 2-phenoxyethyl methacrylate, phenol ethoxylate monoacrylate, p-chlorophenyl acrylate, KAYARAD R551 (the trade name of an acrylic monomer made by Nippon Kayaku Co., Ltd.) and KAYARAD DPHA (the trade name of an acrylic monomer made by Nippon Kayaku Co., Ltd.). The polymerizable monomer should not, however, be limited to these examples. Among these polymerizable monomers, preferred are monomers which are liquid at ordinary temperature and ordinary pressure and have a boiling point of 100° C. or higher at ordinary pressure. If necessary, two or more of these polymerizable monomers may be mixed and used. Incidentally, KAYARAD R551 can be represented by the following formula:

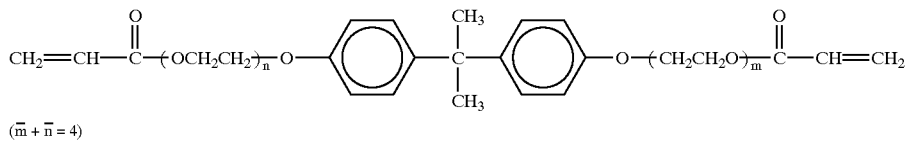

$(\overline{m} + \overline{n} = 4)$

KAYARAD DPHA can be represented by the following formula, and is a mixture of the compound wherein a is 5 and b is 1, and the compound wherein a is 6 and b is 0:

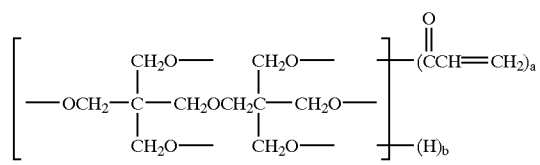

Examples of a polymerization initiator for polymerizing the above-mentioned polymerizable monomer include organic peroxide such as tert-butylperoxy-iso-butalate, 2,5-dimethyl-2,5-bis(benzoyldioxy)hexane, 1,4-bis[α-(tert-butyldioxy(-iso-propoxy)benzene, di-tert-butylperoxide, 2,5-dimethyl-2,5-bis(tert-butyldioxy)hexenehydroperoxide, α-(iso-propylphenyl)-iso-propylhydroperoxide, 2,5-bis (hydroperoxy)-2,5-dimethylhexane, tert-butylhydroperoxide, 1,1-bis(tert-butyldioxy)-3,3,5-trimethylcyclohexane, butyl-4,4-bis(tert-butyldioxy) valerate, cyclohexanoneperoxide, 2,2',5,5'-tetra(tert-butylperoxycarbonyl)benzophenone, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3'-bis(tert-butylperoxycarbonyl)-4,4'-dicarboxybenzophenone, tert-butylperoxybenzoate, and di-tert-butyldiperoxyisophthalate; quinones such as 9,10-anthraquinone, 1-chloroanthraquinone, 2-chloroanthraquinone, octamethylanthraquinone, and 1,2-benzanthraquinone; and benzoin derivatives such as benzoin methyl, benzoin ethyl ether, α-methylbenzoin and α-phenylbenzoin.

As the polymerization initiator, there may also be used compounds described in "Macromolecules" 10, 1307 (1977), for example, triarylphosphonium salts, diaryliodonium salts, and iron arene complexes.

Examples of triarylphosphonium salts include triphenylphosphonium chloride, triphenylphosphonium bromide, tri(4-methoxyphenyl)phosphonium tetrafluoroborate, tri(p-methoxyphenyl)phosphonium hexafluorophosphonate, and tri(4-ethoxyphenyl)phosphonium tetrafluoroborate.

Examples of diaryliodonium salts include diphenyliodonium chloride, diphenyliodonium trifluoromethanesulfonate, diphenyliodonium mesylate, diphenyliodonium tosylate, diphenyliodonium bromide, diphenyliodonium tertafluoroborate, diphenyliodonium hexafluorophosphate, diphenyliodonium hexafluoroantimonate, diphenyliodonium hexafluoroarsenate, bis(p-tert-butylphenyl)iodonium hexafluorophosphate, bis(p-tert-butylphenyl)iodonium mesylate, bis(p-tert-butylphenyl)iodonium tosylate, bis(p-tert-butylphenyl)iodonium trifluoromethanesulfonate, bis(p-tert-butylphenyl)iodonium tetrafluoroborate, bis(p-tert-butylphenyl)iodonium chloride, bis(p-chlorophenyl) iodonium chloride, and bis(p-chlorophenyl)iodonium tetrafluoroborate.

In order to give photosensitivity to the polymer dye of the present invention, the polymer dye may be mixed with a photosensitive material. Such a photosensitive material includes a material whose solubility in a developing liquid is decreased by exposure to light, and a material whose solubility in a developing liquid is increased by exposure to light.

An example of the material whose solubility in a developing liquid is decreased by exposure to light is a combination of a light-polymerizable monomer with a photoinitiator which causes the polymerization of the monomer by irradiation with light.

Examples of the light-polymerizable monomer include bifunctional, trifunctional and polyfunctional monomers. Examples of the bifunctional monomer include 1,6-hexanediol diacrylate, ethyleneglycol diacrylate, neopentylglycol diacrylate, and triethyleneglycol diacrylate. Examples of the trifunctional monomer include trimethylolpropane triacrylate, and pentaerythritol triacrylate. Examples of the polyfunctional monomer include ditrimethylolpropane tetraacrylate, and dipentaerythritol pentaacrylate. The added amount of the photopolymerizable monomer is not especially limited, but is preferably from 0.5 to 2 parts by weight based on 1 part by weight of the polymer dye of the present invention.

The photoinitiator for the light-polymerizable monomer includes triazine, acetophenone, thioxanthone, benzoin, benzophenone, diazo, and azide compounds. Examples of the triazine compound include 2,4,6-tris(trichloromethyl)-s-triazine, 2-(p-methoxystyryl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(p-chloroyphenyl)-4,6-bis(trichloromethyl)-s-triazine, 2-(4'-methoxy-1'-naphtyl)-4,6-bis(trichloromethyl)-s-triazine, 2-(N-isoamyloxycarbonylmethyl-3'-carbazolyl)-4,6-bis(trichloromethyl)-s-triazine, 2-(N-(2"-methoxy-1"-methylethoxycarbonylmethyl)-3'-carbazolyl)-4,6-bis(trichloromethyl)-s-triazine, 2-(N-cyclohexyloxycarbonylmethyl-3'-carbazolyl)-4,6-bis(trichloromethyl)-s-triazine, 2-(4-methylthiophenyl)-bis(4,6-trichloromethyl)-s-triazine, 2-(4-methoxy-β-styryl)-bis(4,6-trichloromethyl)-s-triazine, and 2-(3-chlorophenyl)-bis(4,6-trichloromethyl)-s-triazine.

Examples of the acetophenone compound include 4-phenoxydichloroacetophenone, 2-hydroxy-2-methyl-1-phenyl(4-dodecyl)propane-1-one, 1-hydroxycyclohexylphenylketone, and 2-methyl-2-morpholino(4-thiomethylphenyl)propane-1-one. Examples of the thioxanthone compound include 2-methylthioxanthone, 2-isopropylthioxanthone, 2,4-dimethylthioxanthone, and 2,4-diisopropylthioxanthone. Examples of the benzoin compound include benzoin isopropyl ether, benzoisobutyl ether, and benzyl dimethyl ketal. Examples of the benzophenone compound include 4-benzoyl-4'-methyl-diphenylsulfide, and 3,3'-dimethyl-4-methoxybenzophenone. Examples of the diazo compound include diazonium salts produced by the reaction of a condensate of p-diazodiphenylamine and formaldehyde with hexafluorophosphate, tetrafluoroborate, perchlorate, p-toluenesulfonic acid, or 2-hydroxy-4-methoxybenzophenon-5-sulfonic acid. Examples of the azide compound include 4,4'-diazidestylbene, 4,4'-diazidebenzophenone, 4,4'-diazidechalcone, and 4,4'-diazidediphenylmethane, and p-phenylene bis-azide.

The above-mentioned photoinitiator may be used with a photosensitizer. The photosensitizer includes thioxanthone and xanthone compounds.

When the above-mentioned photosensitive material is used, the polymer dye of the present invention and the photosensitive material may be mixed with a resolution-improving resin and a solvent to prepare a photosensitive colored composition. This photo-sensitive colored composition can be applied to a substrate by spin coating so as to be made up to a coating layer. Concerning the applied coating layer, its solubility in the solvent is lowered by exposure thereof to light. Therefore, a mask having desired openings or transparent parts is put on the coating film, is exposed to light through this mask, and is developed with a developer to cause the coating film in the site exposed to the light to remain selectively on the substrate. In this way, a pattern can be made.

Examples of the resolution-improving resin include (meth)acrylic resin, polyester resin, epoxy resin, phenolic resin such as p-hydroxystyrene, and copolymer thereof. The molecular weight of this resin is preferably from 3000 to 150000, and more preferably from 10000 to 80000. If the molecular weight is less than 3000, sensitivity is insufficient. If the molecular weight is more than 150000, developability is lowered.

As the solvent, use may be. made of a solvent which will be described in detail hereinafter (except water). when this photosensitive material is used, it is preferable to add 50 to 90% by weight of the solvent to 10 to 50% by weight of a solid obtained by mixing 25 to 60% by weight of the polymer dye of the present invention, 10 to 50% by weight of the light-polymerizable monomer, 5 to 20% by weight of the photoinitiator, and 2 to 30% by weight of the resin to prepare a photosensitive colored composition.

Further, an example of the material whose solubility in a developing liquid is lowered by exposure to light is a combination of a resin, a photoacid generator, which generates an acid by irradiation with light, and a crosslinking agent, which causes the resin to be crosslinked by heat in the presence of the generated acid.

As the resin, there may be used a copolymer of any ones of a monomer having an alcoholic hydroxyl group, a monomer having a phenolic hydroxyl group, a monomer having a carboxyl group, and a monomer having an alcoholic hydroxyl group and a carboxyl group.

Examples of the monomer having an alcoholic hydroxyl group include 2-hydroxyethyl (meth)acrylate, 2-hydroxypropyl (meth)acrylate, 2-hydroxybutyl (meth)acrylate, 4-hydroxybutyl (meth)acrylate to which ε-caprolactam is added, polyethyleneglycol mono(meth)acrylate, propyleneglycol mono(meth)acrylate, 2-hydroxyethyl (meth)acrylate to which anhydride of dibasic acid or ethyleneoxide is added, (meth)acrylic acid to which phenylglycigyl ether is added, glycigyl (meth)acrylate to which mono-carboxylic acid is added, allyl alcohol, and allyoxyethanol. Examples of the monomer having a phenolic hydroxyl group include phenolic monomers, typical examples of which are phenol novolak and p-hydroxystyrene. The monomer is preferably used in an amount of 5 to 50% by weight of the copolymer. If the amount is less than 5% by weight, sensitivity is lowered. If the amount is more than 50% by weight, the balance between swelling and developability deteriorates.

Examples of the monomer having a carboxyl group include acrylic acid, methacrylic acid, crotonic acid, vinylbenzoic acid or (meth)acrylic acid to which caprolactam is added, and hydroxyalkyl (meth)acrylate to which anhydride such as phthalic anhydride is added. This monomer is preferably used in an amount of 5 to 50% by weight of the copolymer. If the amount is less than 5% by weight, sensitivity is lowered. If the amount is more than 50% by weight, the balance between swelling and developability deteriorates.

Examples of other monomers which can be copolymerized with the monomer having an alcoholic hydroxyl group and a carboxyl group, or the monomer having an alcoholic hydroxyl group or a carboxyl group include aliphatic (meth)acrylate such as methyl (meth)acrylate, ethyl (meth)acrylate, butyl (meth)acrylate, and cyclohexyl (meth)acrylate; aromatic group containing (meth)acrylate such as phenyl (meth)acrylate, phenoxyethyl (meth)acrylate, and benzyl (meth)acrylate; styrene and styrene derivatives; N-substituted maleimide such as phenyl maleimide and cyclohexyl maleimide. One or more kinds of these monomers may be used.

The molecular weight of the resin (copolymer) is preferably from 3000 to 150000, and more preferably from 15000 to 80000. If the molecular weight is less than 3000, sensitivity is insufficient. If the molecular weight is more than 150000, developability deteriorates.

The photoacid generator includes triazine compounds and onium salt compounds. The triazine compounds include the above-mentioned triazine photoinitiator.

Examples of the onium salt compounds include diphenyliodonium tetrafluoroborate, diphenyliodonium hexafluorophosphate, diphenyliodonium hexafluoroacetate, diphenyliodonium trifluoromethanesulfonate, diphenyliodonium trifluoroacetate, diphenyliodonium-p-toluenesulfonate, 4-methoxyphenylphenyliodonium tetrafluoroborate, and 4-methoxyphenylphenyliodonium hexafluorophosphate.

As the crosslinking agent, compounds having an N-methylol structure may be used. There may be used, for example, methylol urea, urea resin, methylol melamine, butylol melamine, methylol guanamine, or alkyl ethers of these compounds. From the standpoint of high thermostability, the alkyl ethers are preferable. As the alkyl group of the alkyl ethers, alkyl groups having 1 to 5 carbon atoms are preferable. Among the alkyl ethers, alkyl ethers of hexamethylol melamine are more preferable from the viewpoint of sensitivity.

When the above-mentioned photosensitive material is used, the polymer dye of the present invention and the photosensitive material may be mixed with a solvent to prepare a photosensitive colored composition. This photosensitive colored composition can be applied to a substrate by, for example, spin coating to be made up to a coating layer. By exposing the applied coating film to light, an acid is generated from the acid-generator. By heating the coating layer subsequent to the exposure to the light, the above-mentioned resin and the crosslinking agent are crosslinked so that its solubility in the solvent is lowered. Therefore, a mask having desired openings or transparent parts is put on the coating film, and is exposed to light through this mask, and is further developed with a developer to cause the coating film in the site exposed to the light to remain selectively on the substrate. In this way, a pattern can be made. As the solvent, use may be made of a solvent which will be described in detail hereinafter (except water).

When this photosensitive material is used, it is preferable to add 50 to 90% by weight of the solvent to 10 to 50% by weight of a solid obtained by mixing 25 to 60% by weight of the polymer dye of the present invention, 5 to 20% by weight of the photoacid generator, 2 to 30% by weight of the crosslinking agent, and 2 to 50% by weight of the resin to prepare a photosensitive colored composition.

An example of the photosensitive material whose solubility in a developing liquid is increased by exposure to light is a combination of a resin and a photosensitive agent that causes this resin to be decomposed and denatured by irradiation with light so as to increase the solubility of the resin in a developer.

Examples of this resin include Novolak resin, polyvinyl alcohol, polyvinyl alkyl ether, copolymers of styrene and acrylic acid, copolymers of methacrylic acid and alkyl ester, polymers of hydroxystyrene, polyvinyl hydroxybenzoate, and polyvinyl hydroxybenzal.

The photosensitive agent includes 1,2-naphthoquinone compounds. Examples thereof include ester of 2,3,4-trihydroxybenzophenone and 1,2-naphthoquinonediazide-4-sulfonic acid, ester of 2,3,4-trihydroxybenzophenone and 1,2-naphthoquinonediazide-5-sulfonic acid, ester of 2,3,4,4'-tetrahydroxybenzophenone and 1,2-naphthoquinonediazide-4-sulfonic acid, ester of 2,3,4,4'-tetrahydroxybenzophenone and 1,2-naphthoquinonediazide-5-sulfonic acid, ester of 2,2',3,4,4'-pentahydroxybenzophenone and 1,2-naphthoquinonediazide-4-sulfonic acid, and ester of 2,2',3,4,4'-pentahydroxybenzophenone and 1,2-naphthoquinonediazide-5-sulfonic acid.

When this photosensitive material is used, the polymer dye of the present invention and the photosensitive material may be mixed with a solvent to prepare a photosensitive colored composition. This photosensitive colored composition can be applied to a substrate by, for example, spin coating to be made up to a coating layer. By exposing the applied coating film to light, the resin is decomposed or denatured so that its solubility in the solvent is lowered. Therefore, a mask having desired openings or transparent parts is put on the coating film, and is exposed to light through this mask, and is further developed with a developer to cause the coating film in the site non-exposed to the light to remain selectively on the substrate. In this way, a pattern can be made. As the solvent, there may be used solvent which will be described in detail hereinafter (except water).

When this photosensitive material is used, it is preferable to add 50 to 90% by weight of the solvent to 10 to 50% by weight of a solid obtained by mixing 25 to 60% by weight of the polymer dye of the present invention, 5 to 20% by weight of the photosensitizer, and 2 to 50% by weight of the resin, to prepare a photosensitive colored composition.

The color filter of the present invention can be made by applying a colored solution containing the polymer dye of the present invention onto a substrate, and then performing an etching method or a direct photolithographic method. The colored solution contains the polymer dye of the present invention or a polymerizable dye monomer of the present invention in the solvent, and may further contain any one of the above-mentioned polymerizable monomers, the photosensitive material, the photoinitiator, and/or the crosslinking agent.

The substrate to be used may be any one if it has transparency and an appropriate strength and is not damaged by the colored solution. Specific examples thereof include a glass plate, a polycarbonate plate, a polymethyl methacrylate plate, and a polyester film. The substrate should not, however, be limited to these examples. The application of the colored solution to the substrate may be carried out by using a spin coater, a roll coater, a bar coater or the like.

If necessary, the colored solution may be diluted with an appropriate solvent at the time of the application of the colored solution. In this case, drying is necessary after the colored solution is applied to the substrate. The solvent which can be used in the preparation of the colored solution may be any one if it does not have an influence of dissolution, swelling, whitening, or erosion on the substrate. Thus, almost all of solvents that are conventionally used can be used. Specific examples thereof include water, methanol, ethanol, propanol, isopropyl alcohol, n-butanol, t-butanol, 2-methylpropyl alcohol, chloroform, dichloromethane, tetrachlorocarbon, 1,4-dioxane, tetrahydrofuran, acetone, ethyl methyl ketone, ethyl acetate, acetonitrile, toluene, xylene, cyclohexane, cyclohexanone, n-pentane, n-heptane, n-hexane, 2-methoxyethanol, 2-ethoxyethanol, 2-butoxyethanol, 2-ethoxyethyl acetate, 2-butoxyethyl acetate, 2-methoxyethyl acetate, 2-ethoxyethyl ether, 2-(2-ethoxyethoxy)ethanol, 2-(2-butoxyethoxy)ethanol, 2-(2-ethoxyethoxy)ethyl acetate, 2-(2-butoxyethoxy)ethyl acetate, 2-phenoxyethanol, diethyleneglycol and dimethyl ether. The solvent is not, however, limited to these examples. Any solvent, if it meets the above-mentioned requirement, may be used. If necessary, two or more kinds of the solvents may be mixed and used.

A binder resin may be mixed with the colored solution. The binder may be any suitable binder resin, and must meet the requirements that it forms a coating film on the substrate by application onto the substrate, and the thus formed coating film can be patterned accurately. As such a binder, polyimide resin can be preferably used. Namely, a precursor of polyimide resin is mixed with the colored solution to prepare a coating, and the coating is applied onto a substrate by, e.g., spin coating and then is dried, so that a coating film can be formed on the substrate. The coating film can be accurately processed into a desired pattern by applying a photosensitive resin onto the coating film, putting a mask having desired openings or transparent portions on the resin, exposing the resin to light through this mask, developing the resin to expose the coating film partially, and etching/removing the coating film in the partially-exposed portion. After the patterning, heating treatment is applied to the resultant, to polymerize the above-mentioned precursor. This makes it possible to bond the substrate and the coating film firmly.

This polyimide precursor may be prepared by reacting an acid dianhydride and a diamino compound. Examples of the acid dianhydride for synthesizing the polyimide precursor include dianhydrides of pyromellitic acid, 3,3',4,4'-benzophenone tetracarboxylic acid, 2,2', 3,3'-benzophenone tetracarboxylic acid, 3,3',4,4'-biphenyltetracarboxylic acid, 3,3',4,4'-diphenylsulfonic tetracarboxylic acid, 4,4'-oxydiphthalic acid, 2,3,5-tricarboxylcyclopentylacetic acid, 1,2,3,4-cyclobutanetetracarboxylic acid, and 1,2,3,4-cyclopentanetetracarboxylic acid. A combination of two or more kinds of these anhydrides may be used.

Examples of the diamino compound for synthesizing the polyimide precursor include 4,4'-diaminodiphenyl ether, 3,3'-diaminodiphenyl ether, 4,4'-diaminodiphenylmethane, 3,3'-diaminodiphenylmethane, 4,4'-diaminodiphenylsulfone, 3,3'-diaminodiphenylsulfone, paraphenylenediamine, metaphenylenediamine, 3,3'-diaminobenzophenone, 4,4-diaminobenzophenone, 1,4-bis(4-aminophenoxy)benzene, 1,3-bis(3-aminophenoxy)benzene, and bis(4-aminophenyl)tetramethyldisiloxane. A combination of two or more kinds of these diamino compounds may be used.

The following will describe steps for obtaining the color filter of the present invention.

Figure 2:
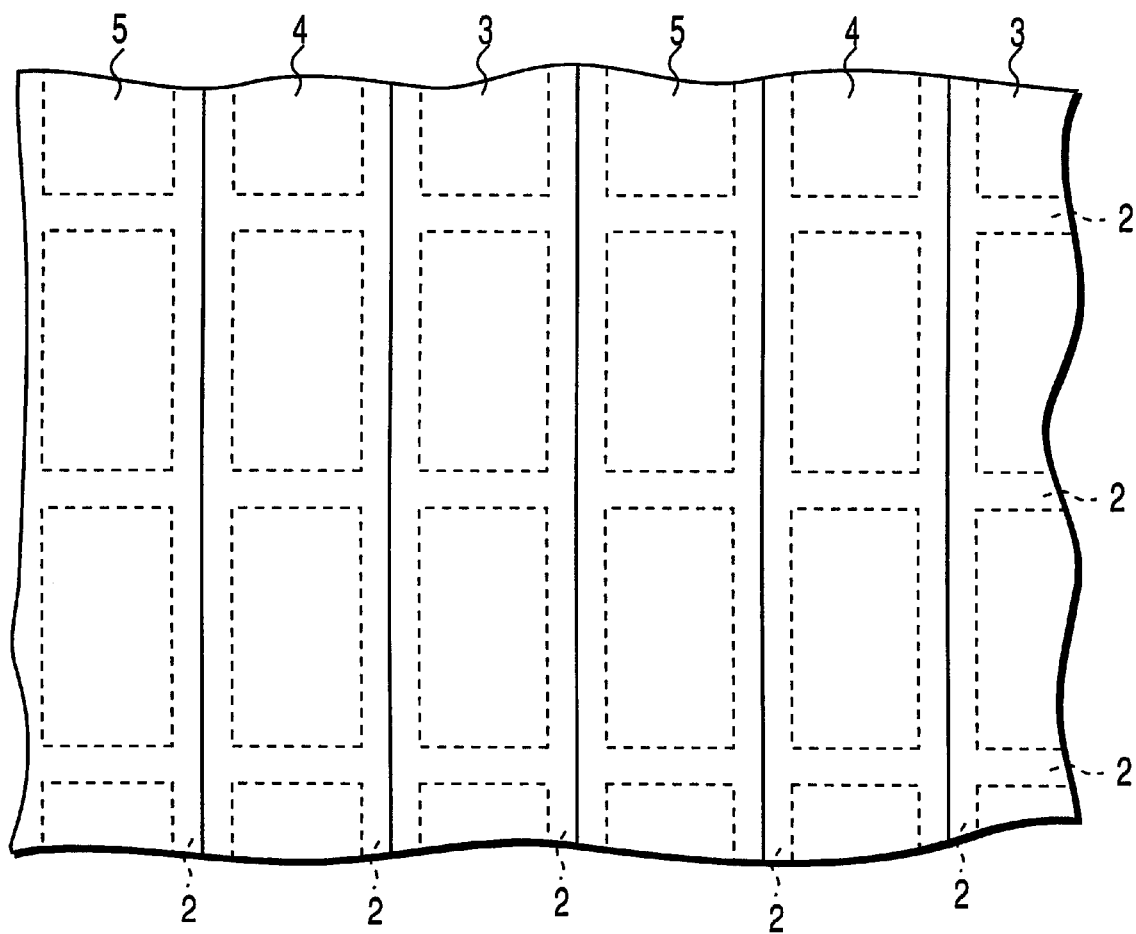
FIG. 2 is a plane view of the color filter shown in FIG. 1.

FIG. 1 is a cross sectional view of a color filter according to the present invention. A plurality of colored layers (for example, R (red) layers 2, G (green) layers 4, and B (blue) layers 5) are formed on a transparent substrate 1. These colored layers are made in various patterns in a relief form. The colored layers constitute, as a whole, a pattern in two or more colors. In many cases, a light-shielding pattern 2 (a so-called black matrix) is arranged between the colored, transparent relief patterns 3, 4 and 5. This light-shielding pattern 2 can be formed by depositing a pattern of chromium, chromium oxide or a resin in a known manner on the transparent substrate 1. The kinds of the pattern are various. A typical pattern thereof is a stripe pattern as shown in FIG. 2 (a plane view).

First, the colored solution is applied onto the transparent substrate, and is subjected to pre-baking, preferably at 50 to 120° C. for 1 to 20 minutes. The thickness of the applied film is arbitrary, but the thickness after the pre-baking is usually about 1 $\mu$m in views of spectroscopic transmissivity.

As a first process after the above-mentioned step, an etching method can be adopted. In this method, a photoresist layer is further deposited on the colored layers obtained as above. In this case, a middle layer may be deposited to prevent the photoresist layer and the colored layers from being intermingled. This is irradiated with light in a pattern form through a mask. Subsequently, the photoresist layer is developed with an organic solvent, water or an alkaline solution, and is rinsed with water or an appropriate organic solvent, and is further dried to form a pattern of the photoresist. Through the pattern, the colored layers are selectively removed with an organic solvent, water or an alkaline solution which does not damage the resist. Thereafter, the resist is stripped to pattern the colored layers.

As other process, a direct photolithographic method can be adopted. In this method, any photoresist layer is not deposited. A colored solution also containing, for example, the above-mentioned polymerizable monomer and photoinitiator is applied on the substrate, and then the applied layer is pre-baked. Thereafter, the resultant film is irradiated with light in a pattern form through a mask. An active species for initiating polymerization is produced in the portions of the colored layers that are irradiated with the light. In the irradiated portions, the colored layers are hardened. Subsequently, development is performed to pattern the colored layers.

In both of the processes, the above-mentioned consecutive steps are repeated necessary times, with the colored agent and the pattern being altered into desired ones, so as to obtain colored patterns in which necessary colors are combined.

In order to react polymerizable functional groups remaining in the patterns completely after the formation of the patterns, post-heating may be performed. The heating may be performed after patterning each of the colored layers, or after patterning all of the colored layers. The heating is preferably performed at 150 to 200° C. for 30 minutes to 2 hours.

The thus obtained color filter has high contrast ratio, transparency and color purity, and excellent resistance against heat, light, chemicals, and sublimation.

A liquid crystal display (LCD) device according to the present invention has a structure known in the art except for the color filter used. The device of the invention basically includes liquid crystal filled between a pair of transparent substrates. A pixel electrode is provided on one of the substrate, while an opposing pixel electrode is provided on the other substrate. The substrates are arranged such that the pixel electrodes on the substrates face with each other.

Figure 3:
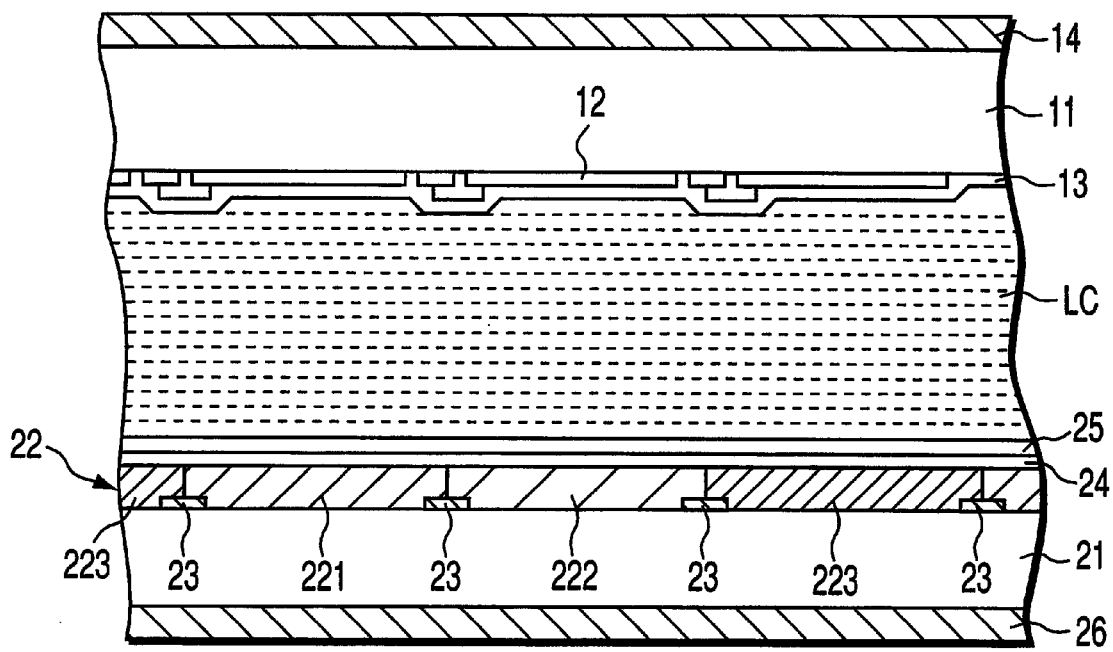
FIG. 3 is a cross sectional view of an example of a liquid crystal display device having a color filter of the present invention.

FIG. 3 shows an example of an LCD device into which a color filter of the present invention is incorporated. The LCD device shown in FIG. 3 has liquid crystal LC sealed between a pair of transparent substrates 11 and 21, such as glass substrates. As liquid crystal LC, usually, use may be made of twisted nematic liquid crystal or super-twisted nematic liquid crystal, whose molecules are twisted at 90° to 270° according to the driving mode.

On the lower surface of the one substrate 11, a pixel electrode 12 is provided, on which an orientation film 13, subjected to orientation treatment such as rubbing, is provided. On the upper surface of the substrate 11, a polarizing plate 14 is provided.

On the upper surface of the other substrate 21, a color filter 22 of the invention including red colored layers 221 (corresponding to layers 3 in FIGS. 1 and 2), green colored layers 222 (corresponding to layers 4 in FIGS. 1 and 2), and blue colored layers 223 (corresponding to layers 5 in FIGS. 1 and 2) is provided through black matrix 23 (corresponding to the light-shielding pattern 2 in FIGS. 1 and 2). On the color filter 22, an opposing electrode 24 is provided, over which an orientation film 25, subjected to an orientation treatment similarly to the orientation film 13 is provided. Further, on the lower surface of the substrate 21, a polarization plate 26 is provided. The polarization plate 26 may be provided directly on the upper surface of the substrate 21, and the color filter 22, the pixel electrode 24 and the orientation film 25 may be provided thereover. This arrangement makes it possible to reduce the dependency on the angle of visibility, and provide a display of high image quality.

The following will specifically describe the present invention by way of examples about color filters made by the photolithographic method. The present invention should not, however, be limited to these Examples.

Synthesis Example 1

Synthesis of Anthraquinone Dye Monomer No. 6 in Table A

A mixture of 5.0 g of 1-amino-4-hydroxyanthraquinone, 11.3 g of p-toluidine, 0.32 g of boric acid, and 1.8 g of acetic acid was reacted at 145° C. for 20 hours. After the reaction, the reaction solution was cooled and poured into 500 ml of methanol. The precipitate was separated by filtration, and purified by column chromatography to yield 3.2 g of the following intermediate (A).

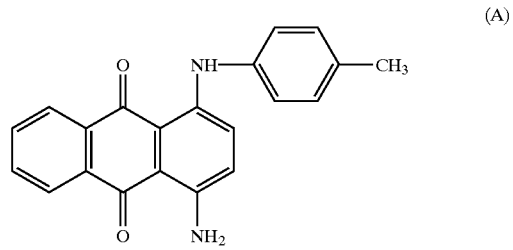

(A)

In 50 ml of dimethylformamide (DMF), 3.0 g of the intermediate (A), 1.6 g of p-chlorobenzyl alcohol, 8 g of potassium carbonate, and 0.1 g of potassium iodide were stirred at 120° C. for 5 hours. After filtration, DMF was removed under reduced pressure and purification was carried out by column chromatography to yield 3.5 g of the following intermediate (B).

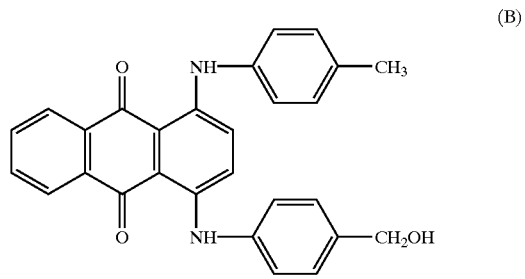

(B)

Next, 3.0 g of the intermediate (B) and 1.1 g of triethylamine were dissolved into dichloromethane, and then a solution of 0.92 g of acrylic acid chloride in dichloromethane was added thereto. The resultant solution was stirred for 3 hours at room temperature, and then purified by column chromatography to yield 2.6 g of anthraquinone dye monomer No. 6.

Synthesis Example 2

Synthesis of Anthraquinone Dye Monomer No. 2 in Table A

Into a solution of 10 g of p-chlorobenzyl alcohol in tetrahydrofuran (THF) were added 6.5 g of 3,4-dihydro-2H-pyran and 0.2 g of p-toluenesulfonic acid, and the resultant mixture was stirred at room temperature for 2 hours. After THF was removed, the residue was dissolved into ether. The solution was washed with water, and then the ether phase was collected. The ether was evaporated off to yield 12 g of the following compound (C).

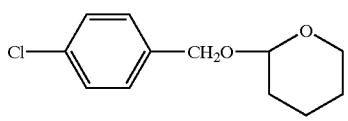

In 200 ml of DMF, 5.0 g of 2,4-diamino-1,9-anthrapyrimidine, 5.1 g of the compound (C), 20 g of potassium carbonate, and 0.3 g of potassium iodide were stirred at 120° C. for 5 hours. After filtration, DMF was removed under reduced pressure, and purification was carried out by column chromatography to yield 4.5 g of the following intermediate (D).

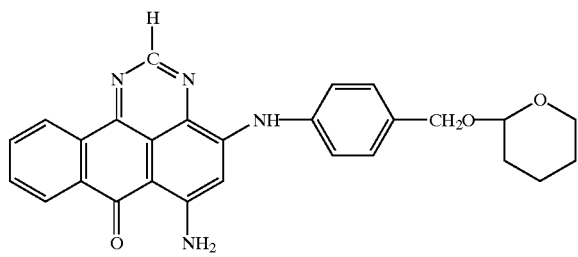

Subsequently, 4.5 g of the compound (D) and 1.2 g of triethylamine were dissolved into dichloromethane, and then a solution of 2.5 g of 2,5-dichlorobenzoyl chloride in dichloromethane was added thereto. The resultant solution was stirred at room temperature for 3 h ours. The reaction mixture was purified by column chromatography to yield 5.0 g of the following intermediate (E).

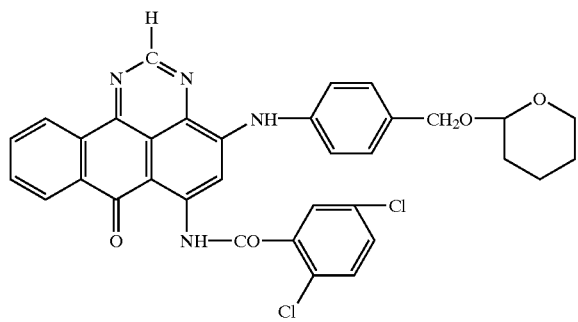

Next, 5.0 g of the intermediate (E) were dissolved into a mixture solution of methanol and acetic acid, and then the solution was heated at 60° C. for 8 hours to de-protect the hydroxyl group. The resultant material was purified by column chromatography, and then dissolved into dichloromethane. Into the resultant solution were dissolved 1.2 g of triethylaminde, and then 1.1 g of acrylic acid chloride were added thereto. The resultant solution was stirred at room temperature for 3 h ours, and then purified by column chromatography to yield 3.5 g of the target anthraquinone dye monomer No. 2.

Synthesis Example 3

Synthesis of Anthraquinone Dye Monomer No. 8 in Table A

In 100 ml of DMF, 5.0 g of 1,4-diaminoanthraquinone, 3.6 g of methyl iodide and 18 g of potassium carbonate were stirred at 120° C. for 5 hours. After filtration, DMF was removed under reduced pressure, and purification was carried out by column chromatography to yield 3.5 g of the following intermediate (F).

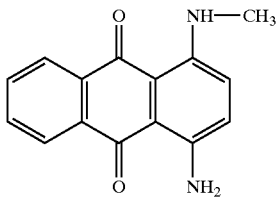

Subsequently, in 70 ml of DMF, 3.5 g of the compound (F), 2.4 g of p-chlorobenzyl alcohol and 12 g of potassium carbonate were stirred at 120° C. for 5 hours. After filtration, DMF was removed under reduced pressure, and purification was carried out by column chromatography to yield 2.5 g of the target anthraquinone dye No. 8.

Synthesis Example 3

Synthesis of Anthraquinone Dye Monomer No. 4 in Table A 5.0 g of 1-amino-4-hydroxyanthraquinone, 9.3 g of amylamine, 0.32 g of boric acid and 1.8 g of acetic acid were mixed. The mixture was reacted at 145° C. for 20 hours. After the reaction, the reactant solution was cooled and poured into 500 ml of methanol. The precipitate was separated by filtration, and then purified by column chromatography to yield 3.2 g of the following intermediate (G).

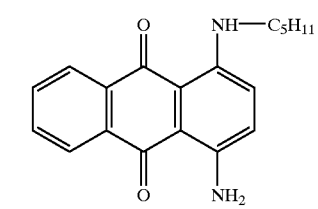

Subsequently, in 70 ml of DMF, 3.0 g of the compound (G), 1.2 g of vinyl chloroacetate and 12 g of potassium carbonate were stirred at 120° C. for 5 hours. After filtration, DMF was removed under reduced pressure, and purification was carried out by column chromatography to yield 2.5 g of the target reactive dye (anthraquinone dye No. 4).

Synthesis Example 4

Synthesis of the Compound Represented by the Formula (2)

Into 120 g of N-methyl-2-pyrrolidone were dissolved 11.5 g of 1-amylnaphthalene, and then 3.74 g of sodium amide were added to the resultant solution while the solution was stirred at room temperature. Into the solution were added 1.20 g of sodium iodide as a catalyst and 0.89 g of 2,5-di-t-butylhydroquinone as a polymerization inhibitor. Thereafter, 13.4 g of p-chloromethylstyrene were added thereto over 30 minutes. The resultant solution was stirred at room temperature for 2 hours, and then 200 ml of chloroform were added thereto and dissolved. The solution was washed 3 times with water. The solvent was removed from the chloroform phase. The residue was purified by column chromatography to yield 11.6 g of p-vinylbenzylnaphthylamine as an intermediate.

Into 11.6 g of the resultant intermediate were added 18.7 g of 4,4'-bis(diethylamino)benzophenone, 0.53 g of 2,5-di-t-butylhydroquinone as a polymerization inhibitor and 150 g of toluene as a solvent, and then the mixture was heated to 45° C. under nitrogen gas flow. Next, 8.83 g of phosphorus oxychloride were added dropwise over 10 minutes. After the addition, the resultant solution was heated up to 100° C. over 1 hour, and then stirred at 100° C. for 1 hour. After cooling, toluene was distilled off. 200 ml of chloroform were added and dissolved. The solution was washed with 200 ml of water. The solvent was distilled off from the chloroform phase. The residue was purified by column chromatography to yield 20.1 g of Cl⁻ salt of the compound of the formula (2).

500 g of the chloride salt of the compound obtained above were dissolved into 5.83 g of sodium perchlorate (monohydrate), 0.09 g of 2,5-butylhydroquinone as a polymerization inhibitor and 30 g of methanol, and then the mixture was stirred at 60° C. for 1 hour. After cooling, the mixture was diluted with water. The precipitated crystal was separated by filtration, and then was dried to yield 4.51 g of $ClO_4^-$ salt of the compound of the formula (2)

EXAMPLE 1

First, a polymer having no dye was prepared by the following method before the preparation of respective colored solutions.

Into 300 parts by weight of cyclohexanone were dissolved 20 parts by weight of 2-hydroxyethyl methacrylate, 50 parts by weight of methyl methacrylate and 15 parts by weight of methacrylic acid, and then 0.5 part by weight of azoisobutyronitrile was added thereto. The mixture was reacted under nitrogen atmosphere at 60° C. for 10 hours. The polymer solution having no dye was allowed to precipitate and purified in n-hexane, and dried under reduced pressure to yield a terpolymer (weight-average molecular weight: 30,000).

The thus obtained polymer having no dye was used to make a color filter having red, green and blue colors for liquid crystal display. For respective colors, respective colored solutions having the following compositions were prepared.

Red colored solution 1: 20 parts by weight of the polymer having no dye were dissolved into 100 parts by weight of cyclohexanone, and then 15 parts by weight of Pigment Red 168, 5 parts by weight of Pigment Orange 36 and 1 part by weight of a dispersant were added thereto. The mixture was sufficiently kneaded with 3 rollers. Thereafter, 10 parts by weight of pentaerythrytol triacrylate and 1 part by weight of IRGACURE 184 (made by Ciba Specialty Chemical) as a photoinitiator were added thereto, and then the resultant mixture was stirred at room temperature for 3 hours.

Green colored solution 1: 20 parts by weight of the polymer having no dye were dissolved into 100 parts by weight of cyclohexanone, and then 15 parts by weight of Pigment Green 36, 5 parts by weight of Pigment Yellow 154 and 1 part by weight of a dispersant were added thereto. The mixture was sufficiently kneaded with 3 rollers. Thereafter, 10 parts by weight of pentaerythrytol triacrylate and 1 part by weight of IRGACURE 184 (made by Ciba Specialty Chemical) as a photo initiator were added thereto, and then the resultant was stirred at room temperature for 3 hours.

Blue colored solution 1: 20 parts by weight of the polymer having no dye were dissolved into 100 parts by weight of cyclohexanone, and then 5 parts by weight of Pigment Blue 15, 1 part by weight of Pigment Violet 23 and 1 part by weight of a dispersant were added thereto. The mixture was sufficiently kneaded with 3 rollers. Thereafter, 10 parts by weight of a copolymer (polymer having a dye) composed of anthraquinone dye monomer No. 6 (Table A) and methyl methacrylate (molar ratio of 1:1), 10 parts by weight of pentaerythrytol triacrylate and 1 part by weight of IRGACURE 184 were added thereto, and then the resultant mixture was stirred at room temperature for 3 h ours.

After the preparation of the respective colored solutions in the above-mentioned ways, the red colored solution 1 was applied onto a glass substrate (30 cm×30 cm), which was immersed in a chromic acid mixture for 10 minutes and washed with purified water for 30 minutes in an ultrasonic washer, by spin coating, so as to have a thickness of 1.0 μm. After drying, the coated layer was exposed to light in a stripe pattern form by means of a light exposure machine, and then developed with an alkaline developing liquid for 120 seconds, to obtain a red relief pattern in a stripe form. The alkaline developing liquid had the following composition.

Sodium carbonate: 1.5% by weight

Sodium hydrogen carbonate: 0.5% by weight

Anionic surfactant (Pelirex NBL, made by Kao Corp.): 8.0% by weight

Water: 90% by weight

Similarly, the green colored solution 1 was applied by spin coating to have a thickness of 1.0 μm. After drying, the coated layer was exposed to light in the form of a stripe pattern, which was shifted from the above-mentioned red pattern, by means of the light exposure machine, and then was developed to obtain a green relief pattern adjacent to the red relief pattern.

In the same way as above, from the blue colored solution 1, a blue relief pattern, the thickness of which was 1.0 μm, was obtained adjacently to the red and green relief patterns. In this way, a color filter having the stripe patterns in 3 colors, i.e., red, green and blue on the transparent substrate was obtained.

The shapes of the relief patterns having the respective colors were good, and the resolution of the color filter was also good. Finally, the resultant color filter was heated at 180° C. in an oven for 1 hour, to react the remaining polymerizable functional groups completely.

The thus obtained color filter of Example 1 had good spectroscopic property and contrast ratio, and very good resistance against heat, light, chemicals and sublimation. The resistance against the chemicals was evaluated from a change in the spectrum when the color filter was immersed in alcohol, n-hexane, 1N hydrochloric acid solution, 1N NaOH solution for 5 minutes.

EXAMPLE 2

A polymer having no dye, which was similar to the polymer in Example 1, was used to make a color filter having red, green and blue colors for liquid crystal display. For the respective colors, respective colored solutions having the following compositions were prepared.

Red colored solution 2: 20 parts by weight of the polymer having no dye were dissolved into 100 parts by weight of cyclohexanone, and then 20 parts by weight of a copolymer (polymer having a dye) composed of anthraquinone dye monomer No. 2 (Table A) and methyl methacrylate (molar ratio of 1:5), 10 parts by weight of KAYARAD DPHA (Nippon Kayaku Co., Ltd.) and 1 part by weight of bis(p- tert-butylphenyl)iodonium hexafluorophosphate were added thereto. The mixture was stirred at room temperature for 3 h ours.

Green colored solution 2: 20 parts by weight of the polymer having no dye were dissolved into 100 parts by weight of cyclohexanone, and then 20 parts by weight of a copolymer(polymer having a dye) composed of anthraquinone dye monomer No. 8 (Table A) and methyl methacrylate (molar ratio of 1:5), 10 parts by weight of KAYARAD DPHA (Nippon Kayaku Co., Ltd.) and 1 part by weight of bis(p-tert-butylphenyl)iodonium hexafluorophosphate were added thereto. The mixture was stirred at room temperature for 3 h ours.

Blue colored solution 2: 20 parts by weight of the polymer having no dye were dissolved into 100 parts by weight of cyclohexanone, and then 20 parts by weight of anthraquinone dye monomer No. 4 (Table A), 10 parts by weight of KAYARAD DPHA (Nippon Kayaku Co., Ltd.) and 1 part by weight of bis(p-tert-butylphenyl)iodonium hexafluorophosphate were added thereto. The mixture was stirred at room temperature for 3 h ours.

In the same manner as in Example 1, a color filter having the stripe patterns (thickness: 1.0 $\mu$m) in 3 colors, i. e., red, green and blue on the transparent substrate was obtained.

The shapes of the relief patterns having the respective colors were good, and the resolution of the color filter was also good. Finally, the resultant color filter was heated at 180° C. in an oven for 1 hour, to react the remaining polymerizable and condensable functional groups completely.

The thus obtained color filter of Example 2 had good spectroscopic property and contrast ratio, and very good resistances against heat, light and chemicals. The resistance against chemicals was evaluated from a change in the spectrum when the color filter was immersed in alcohol, n-hexane, 1N hydrochloric acid solution, 1N NaOH solution for 5 minutes.

EXAMPLE 3

In Example 3, a polymer having a dye obtained by polymer reaction was used to make a color filter having red, green and blue colors for liquid crystal display. For respective colors, respective colored solutions having the following compositions were prepared.

Red colored solution: 10 parts by weight of 2-hydroxyethyl methacrylate, 50 parts by weight of methyl acrylate, 15 parts by weight of methacrylic acid and 20 parts by weight of p-chloromethylstyrene were dissolved into 300 parts by weight of cyclohexanone, and then 0.5 part by weight of azoisobutyronitrile was added thereto. The mixture was reacted at 60° C. under nitrogen atmosphere for 10 hours. The polymer solution was allowed to precipitate and purified in n-hexane, and then dried under reduced pressure to obtain a terpolymer. In 100 ml of DMF were dissolved 20 g of this terpolymer and 2 g of C. I. Pigment Red 89. The reaction mixture was reacted at 120° C. for 10 hours, cooled and poured into 2L of methanol solution, so as to yield 17 g of a dye-bonded polymer. 20 parts by weight of the dye-bonded polymer were dissolved into 100 parts by weight of cyclohexanone, and then 10 parts by weight of KAYARAD DPHA and 1 part by weight of IRGACURE 651 (made by Ciba Specialty Chemicals) were added thereto. The resultant was stirred at room temperature for 3 h ours.

Green colored solution: 10 parts by weight of 2-hydroxyethyl methacrylate, 50 parts by weight of methyl methacrylate, 15 parts by weight of methacrylic acid and 20 parts by weight of p-aminostyrene were dissolved into 300 parts by weight of cyclohexanone, and then 0.5 part by weight of azoisobutyronitrile was added thereto. The mixture was reacted at 60° C. under nitrogen atmosphere for 10 hours. The polymer solution was allowed to precipitate and purified in n-hexane, and then dried under reduced pressure to obtain a terpolymer. In a flask, 20 g of this terpolymer, 5 g of C. I. Solvent Violet 13, 0.5 g of boric acid and 4.0 g of acetic acid were mixed, and the mixture was reacted at 145° C. for 20 hours. After the reaction, the reactant solution was cooled, and poured into 2L of methanol, to obtain 20 g of the polymer to which the dye was bonded. 20 parts by weight of the dye-bonded polymer were dissolved into 100 parts by weight of cyclohexanone, and then 10 parts by weight of KAYARAD DPHA and 1 part by weight of IRGACURE 651 were added thereto. The resultant was stirred at room temperature for 3 h ours.

Blue colored solution: 10 parts by weight of N-vinylpyrrolidone, 50 parts by weight of methyl methacrylate and 15 parts by weight of methacrylic acid were dissolved into 300 parts by weight of cyclohexanone, and then 0.5 part by weight of azoisobutyronitrile was added thereto. The mixture was reacted at 60° C. under nitrogen atmosphere for 10 hours. The polymer solution was allowed to precipitate and purified in n-hexane, and then dried under reduced pressure to obtain a terpolymer.

To 10 g of the obtained polymer and 100 ml of toluene were added 6 ml of trifluoroacetic anhydride, and the mixture was stirred for 30 minutes. Thereafter, 3 g of C. I. Disperse Blue 3 were added thereto. The mixture was stirred for 5 hours, and then poured into 2L of 5% sodium hydroxide aqueous solution. The resultant precipitate was collected, sufficiently washed with water, and dried to obtain 10 g of the target dye-bonded polymer. 20 parts by weight of the dye-bonded polymer were dissolved into 100 parts by weight of cyclohexanone, and then 10 parts by weight of KAYARAD DPHA and 1 part by weight of IRAGUCARE 651 were added thereto. The resultant mixture was stirred at room temperature for 3 h ours.

In the same manner as in Example 1, a color filter having the stripe patterns (thickness: 1.0 $\mu$m) in 3 colors, i. e., red, green and blue on the transparent substrate was obtained.

The shapes of the relief patterns having the respective colors were good, and the resolution of the color filter was also good. Finally, the resultant color filter was heated at 180° C. in an oven for 1 hour, to react the remaining condensable functional groups completely.

The thus obtained color filter of Example 3 h ad good spectroscopic property and contrast ratio, and very good resistances against heat, light and chemicals. The resistance against chemicals was evaluated from a change in the spectrum when the color filter was immersed in alcohol, n-hexane, 1N hydrochloric acid solution, or 1N NaOH solution for 5 minutes.

EXAMPLE 4

There were mixed 30 g of $ClO_4^-$ salt of the dye monomer of the formula (2), 13 g of 2-acrylamido-2-methylpropanesulfonic acid, 46 g of 2-hydroxyethyl methacrylate, 11 g of methacrylic acid, 4 g of 28% by weight aqueous ammonia, and 5 g of azoisobutyronitrile as a polymerization catalyst, and then the mixture was reacted in a solvent of methylcellosolve at 95° C. for 5 hours. The solvent was distilled off. The resultant copolymer (referred to as polymer A hereinafter) had a number-average molecular weight of 13300 and a weight-average molecular weight of 18200.

A polyimide precursor was prepared by the following method. In a 3-necked flask, 77.5 g of cyclohexanone were put. To this compound were added 9.1 g of 4,4'-diaminodiphenyl ether and 0.5 g of bis(3-aminopropyl) tetramethyldisiloxane at 50° C. under stirring. Thus, they were dissolved therein. Next, the resultant was reacted at 50° C. for 3 hours while 12.9 g of 3,3',4,4'-biphenyltetracarboxylic dianhydride were added in increments thereto.

Into 61.0 g of cyclohexanone were dissolved 13.0 g of polymer A, and then 22.0 g of the polyimide precursor were mixed therein, to prepare a colored composition.

The resultant colored composition was spin-coated to a thickness of 1.2 μm, and dried. Thereafter, the layer was heated at 120° C. for 20 minutes. A positive resist (Microposit S1400, made by Shiplay Corp.) was applied onto the heated layer by spin coating, and then heated at 100° C. for 10 minutes. Next, the resist was exposed to light from a high-pressure mercury lamp through a mask having a pixel size of 30 μm×100 μm (3 kw and 200 mJ/cm$^2$), and then etched with a developing liquid (an aqueous solution of 0.4% by weight sodium hydroxide and 0.5% by weight sodium carbonate). The resist was stripped in ethyleneglycol monoethyl ether acetate at a temperature of 30° C. The resultant color filter pattern was then heated at 200° C. for 1 hour to fix the pattern. As a heat resistance test, its spectroscopic transmissivity was measured (OSP-SP200, made by OLYMPAS). The difference between colors before and after the post-baking is shown in Table 1. The transmissivity after the post-baking is shown in Table 2. As a weather resistance test, the resultant was exposed to light from a xenon lamp (100000 lux) to measure a spectroscopic change. The result is shown in Table 3.

EXAMPLE 5

There were mixed 20.6 g of a cyclohexanone solution of polymer A (solid concentration: 20% by weight), 1.3 g of 2-(p-methoxystyryl)-4,6-bis(trichloromethyl)-s-triazine, 2.7 g of dipentaerythrytol hexacrylate, 3.2 g of an acrylic resin [a binder resin obtained by dissolving (a) 5.0 g of methacrylic acid, (b) 3.7 g of 2-hydroxyethyl methacrylate, (c) 2.5 g of methyl methacrylate and (d) 13.7 g of butyl methacrylate into 74.8 g of ethylcellosolve, then adding 0.3 g of azoisobutyronitrile under nitrogen atmosphere and reacting the resultant mixture at 70° C. for 5 hours], and 72.2 g of cyclohexanone and well stirred to prepare a photosensitive colored composition A.

The photosensitive colored composition A was spin-coated to a thickness of 1.2 μm, and dried. Thereafter, the layer was pre-baked at 70° C. for 20 minutes. Next, the layer was exposed to light through a mask having a pixel size of 30 μm×100 μm (the amount of light exposure: 200 mJ/cm$^2$), and then developed with 1% by weight sodium carbonate. The developed layer was sufficiently washed with water and post-baked at 230° C. for 1 hour to fix the pattern. Various evaluations were performed in the same manners in Example 4.

EXAMPLE 6

Into 30 g of a cyclohexanone solution of polymer A (solid concentration: 20% by weight) were added 24.2 g of a resin solution (a solution of a 20% binder resin obtained by dissolving 18.8 g of hydroxyethyl methacrylate, 12.5 g of methyl methacrylate and 68.8 g of butyl methacrylate into 300 g of ethylcellosolve, adding 0.75 g of azoisobutyronitrile thereto under nitrogen atmosphere, and reacting the mixture at 70° C. for 5 hours), 0.392 g of alkylated melamine resin MW-30M (Sanwa Chemical Industry Co., Ltd.), 0.67 g of 2-(4'-methoxy-1-naphtyl)-4,6-bis (trichloromethyl)-s-triazine, and 22.2 g of cyclohexanone. The mixture was sufficiently stirred to prepare a photosensitive colored composition B. Thereafter, a sample was prepared and evaluations were performed in the same manners as in Example 5.

EXAMPLE 7

Into 39.5 g of ethylcellosolve acetate were dissolved 3.0 g of an ester of 2,3,4-trihydroxybenzophenone and 1,2-naphthoquinonediazide-5-sulfonic acid. Into 44.8 g of ethylcellosolve acetate were dissolved 12.0 g of cresol novolack resin (weight-average molecular weight: 9000). The above-mentioned two solutions and 0.7 g of p-toluenesulfonic acid were completely dissolved at 60° C. for 10 minutes. 20 grams of polymer A were dissolved into 100 g of this solution under stirring to prepare a photosensitive colored composition C.

The photosensitive colored composition C was spin-coated to a thickness of 1.2 μm, and dried. Thereafter, the layer was pre-baked at 70° C. for 20 minutes. Next, the pre-baked layer was exposed to light through a mask having a pixel size of 30 μm×100 μm (the amount of light exposure: 200 mJ/cm$^2$), and then developed with a developing liquid (an aqueous solution of 0.4% by weight sodium hydroxide and 0.5% by weight sodium carbonate). The developed layer was sufficiently washed with water and post-baked at 230° C. for 1 hour to fix the pattern. Various evaluations were performed in the same manners in Example 4.

Comparative Example 1

Preparation of a Color Filter Using a Pigment as a Colorant

An acrylic resin was diluted with ethylcellusolve so that the concentration of the resin was 20%. Into 90.1 g of this diluted resin were added 8.91 g of C. I. Pigment Blue 15, 0.09 g of C. I. Pigment Violet 19, and 0.9 g of Solsperse (trade name, made by Zeneka k. K.). The mixture was sufficiently kneaded with 3 rollers to prepare a blue colored resin.

Into 30 g of this blue colored resin were added 24.2 g of an acrylic resin, 5.13 g of dipentaerythrytol hexaacrylate, 1.03 g of 2-(4'-methoxy-1'-naphtyl)-4,6-bis (trichloromethyl)-s-triazine, and 47.4 g of cyclohexanone. The mixture was sufficiently stirred to prepare a photosensitive colored composition. This photosensitive colored composition was made into a color filter in the same manner as in Example 5. Various valuations were performed in the same manners in Example 4.

Comparative Example 2

Preparation of a Color Filter Using a Dye as a Colorant

The following monomers were polymerized by a known solution polymerization method to prepare a polymer: 40% by weight of dimethylaminopropylacrylamide, 15% by weight of 2-hydroxyethyl metahcrylate, 15% by weight of vinylpyrrolidone, 8% by weight of methyl methacrylate, 12% by weight of methyl acrylate, and 10% by weight of dimethylaminoacrylamide.

Into 10.0% by weight of this polymer were added 0.2% by weight of 4,4'-diazidechalcone, 0.6% by weight of a bisazide compound, a silane coupler KBM603 (made by Shin-Etsu Chemical Co., Ltd.), 45.0% by weight of ethylcellosolve, and 45.0% by weight of diethyleneglycol diethyl ether under stirring, to prepare a photosensitive composition.

The photosensitive colored composition C was applied onto a glass plate by spin coating, and dried. Thereafter, the layer was pre-baked at 60° C. for 20 minutes. Next, the resultant was exposed to light through a mask having a pixel size of 30 μm×100 μm (the amount of light exposure: 80 mJ/cm$^2$), and then developed with an aqueous solution of 0.05% by weight of polyethyleneglycol nonylphenyl ether to form a pattern.

This glass plate was dyed at 60° C. for 10 minutes with a 0.1% Blue 43P solution (Blue 43P: a colorant for color filters, made by Nippon Kayaku Co., Ltd.). Various valuations were performed in the same manners in Example 4.

The evaluation results are shown in Tables 1 to 3. As understood from these tables, the color filters comprising the polymer dye of the present invention exhibited far better resistances against heat and weather than the color filter comprising a dye which was not bonded to a polymer (Comparative Example 2). The resistances against heat and weather were equal to those of the color filter comprising a pigment (Comparative Example 1).

TABLE 1

Heat resistance test
(color difference: ΔEab)

| | The difference between colors before and after the post-baking |
|---|---|
| Example 1 | 4.1 |
| Example 2 | 3.1 |
| Example 3 | 3.0 |
| Example 4 | 3.5 |
| Comparative Example 1 | 3.2 |
| Comparative Example 2 | 80.3 |

TABLE 2

Heat resistance test
(transmissivity)

| | Transmissivity after the post-baking (%) | |
|---|---|---|
| | 430 nm | 600 nm |
| Example 1 | 86.3 | 1.0 |
| Example 2 | 91.2 | 1.0 |
| Example 3 | 86.0 | 1.0 |
| Example 4 | 90.2 | 1.0 |
| Comparative Example 1 | 85.3 | 1.0 |
| Comparative Example 2 | 87.0 | 60.3 |

TABLE 3

Weather resistance test
(xenon lamp)

| | Radiation time for not more than 5 ranks of color difference (hours) |
|---|---|
| Example 1 | 500 or more |
| Example 2 | 500 or more |
| Example 3 | 500 or more |
| Example 4 | 500 or more |
| Comparative Example 1 | 500 or more |
| Comparative Example 2 | 10 |

The color filter of the present invention contains, as a colorant, a polymer having a dye in the molecule thereof. Thus, the drawbacks of sublimation of the dye, low heat resistance and low light resistance are compensated, and the advantages of color purity and transparency are maintained. Thus, by conventional color filter producing methods using photolithography, it is possible to obtain color filters having better spectroscopic property, contrast ratio, and resistances against heat, light and chemical than color filters using only a pigment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by appended claims and their equivalents.

What is claimed is:

1. A color filter, comprising a plurality of colored layers which are arranged adjacently to each other and have different spectroscopic properties, wherein at least one of said plural colored layers is obtained by blending a polyfunctional monomer and a photoinitiator with a copolymer of a polymerizable dye and other polymerizable monomer to provide a photosensitive colored composition, which is then applied on a transparent substrate, and photopolymerizing said polyfunctional monomer, said copolymer having been previously made by copolymerizing said dye and said other monomer, said polymerizable dye based on a triphenylmethane dye and said other monomer selected from the group consisting of a styrene compound, a unsaturated carboxylic acid, an ester thereof, an amide thereof, an anhydride thereof, and a vinyl compound, and wherein said composition further contains a soluble polymer.

2. A liquid crystal display device provided with a color filter according to claim 1.

* * * * *